United States Patent
Kim et al.

(10) Patent No.: US 9,425,246 B2
(45) Date of Patent: Aug. 23, 2016

(54) ORGANIC LIGHT EMITTING DISPLAY DEVICE AND METHOD OF REPAIRING THE SAME

(71) Applicant: SAMSUNG DISPLAY CO., LTD., Yongin, Gyeonggi-Do (KR)

(72) Inventors: Tae Gon Kim, Cheonan-si (KR); Sung Ho Cho, Seoul (KR); Yong Chul Kim, Seoul (KR); Ji Yong Park, Yongin-si (KR); Dong-Yoon So, Asan-si (KR); Mi Jin Yoon, Daegu (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/307,743

(22) Filed: Jun. 18, 2014

(65) Prior Publication Data

US 2015/0084014 A1    Mar. 26, 2015

(30) Foreign Application Priority Data

Sep. 23, 2013 (KR) .......................... 10-2013-0112775

(51) Int. Cl.
*H01L 27/32* (2006.01)
(52) U.S. Cl.
CPC ........ *H01L 27/3276* (2013.01); *H01L 27/3223* (2013.01)
(58) Field of Classification Search
None
See application file for complete search history.

(56) References Cited

U.S. PATENT DOCUMENTS

| 2010/0182298 A1* | 7/2010 | Song | G02F 1/1368 345/211 |
| 2014/0347401 A1* | 11/2014 | Hwang | G09G 3/3233 345/690 |

FOREIGN PATENT DOCUMENTS

| KR | 10-0632819 B1 | 9/2006 |
| KR | 10-2007-0046345 A | 5/2007 |
| KR | 10-2008-0078227 A | 8/2008 |
| KR | 10-2008-0100533 A | 11/2008 |
| KR | 10-1087353 B1 | 11/2011 |
| KR | 10-1226711 B1 | 1/2013 |

* cited by examiner

*Primary Examiner* — Whitney T Moore
*Assistant Examiner* — Scott R Wilson
(74) *Attorney, Agent, or Firm* — Lee & Morse, P.C.

(57) ABSTRACT

An organic light emitting display device includes a substrate including a display area and a non-display area, a plurality of scan lines extended in a first direction on the substrate, a plurality of data lines extended in a second direction intersecting the first direction, a plurality of first switching elements in the display area, the plurality of first switching elements being connected to the scan lines and data lines, organic emission layers connected to the first switching elements, first dummy lines between corresponding adjacent ones of the plurality of scan lines, the first dummy lines extending in the first direction, second switching elements disposed in the non-display area, the second switching elements being adjacent to first ends of the first dummy lines, and second dummy lines extended in the second direction, the second dummy lines being adjacent to the second switching elements.

20 Claims, 7 Drawing Sheets

ORGANIC LIGHT EMITTING DISPLAY DEVICE AND METHOD OF REPAIRING THE SAME

CROSS-REFERENCE TO RELATED APPLICATION

Korean Patent Application No. 10-2013-0112775, filed on Sep. 23, 2013, in the Korean Intellectual Property Office, and entitled: "Organic Light Emitting Display Device and Method Of Repairing The Same," is incorporated by reference herein in its entirety.

BACKGROUND

1. Field

The present disclosure relates to an organic light emitting display device and a repairing method thereof.

2. Description of the Related Art

Flat panel displays include, e.g., a liquid crystal display (LCD), a plasma display device (PDP), an organic light emitting diode (OLED) display, an electric field effect display (FED), and an electrophoretic display device. Among flat panel displays, the organic light emitting diode (OLED) display includes two electrodes and an organic emission layer disposed between the two electrodes, so electrons injected from one electrode and holes injected from the other electrode are combined in the organic emission layer to form excitons and emit light via energy generated from the excitons.

In the organic light emitting diode display, when an overcurrent larger than a normal current flows in some pixels due to characteristic deviations of elements included in each pixel, or due to disconnection or a short-circuit in a pixel circuit, such overcurrent may be converted into bright locations, generating pixel defects. In addition, various pixel defects, e.g., stains, may be generated due to inflow of foreign materials.

SUMMARY

A first exemplary embodiment provides an organic light emitting display device, including a substrate including a display area and a non-display area, a plurality of scan lines extended in a first direction on the substrate, a plurality of data lines extended in a second direction intersecting the first direction, a plurality of first switching elements in the display area, the plurality of first switching elements being connected to the scan lines and data lines, organic emission layers connected to the first switching elements, first dummy lines between corresponding adjacent ones of the plurality of scan lines, the first dummy lines extending in the first direction, second switching elements disposed in the non-display area, the second switching elements being adjacent to first ends of the first dummy lines, and second dummy lines extended in the second direction, the second dummy lines being adjacent to the second switching elements.

The organic light emitting display device may further include third switching elements disposed in the non-display area and adjacently formed at the other ends of the first dummy lines.

The organic light emitting display device may further include third dummy lines extended in the second direction and being adjacent to the third switching elements.

Each of the first switching elements may include: a switching thin film transistor configured to include a first source electrode, a first gate electrode, and a first drain electrode; and a driving thin film transistor configured to include a second source electrode, a second gate electrode, and a second drain electrode, and each of the second switching elements may include: a switching thin film transistor configured to include a third source electrode, a third gate electrode, and a third drain electrode; and a driving thin film transistor configured to include a fourth source electrode, a fourth gate electrode, and a fourth drain electrode.

The first dummy lines may be overlapped with the second drain electrodes of the first switching elements.

The first dummy lines may be anode electrodes which connect the second drain electrodes to the organic emission layers.

The first dummy lines may be overlapped with fourth drain electrodes of the second switching element.

The first dummy lines may be overlapped with the data lines.

The first dummy lines may be overlapped with the second dummy lines.

The first dummy lines may be overlapped with the third dummy lines.

The first dummy lines may be formed of the same layer as that of the first to fourth gate electrodes.

The second dummy lines may be connected to the third source electrodes.

The second dummy lines may be formed of the same layer as that of the third source electrodes.

A second exemplary embodiment provides a repairing method of an organic light emitting display device that includes a plurality of intersecting scan and data lines, organic emission layers connected to first switching elements, and first dummy lines between corresponding adjacent ones of the plurality of scan lines and parallel thereto, the method including insulating a first switching element of an organic light emitting layer of a defective pixel from each other, the first switching element being connected to scan and data lines in a display area of a substrate, short-circuiting a first dummy line and the organic emission layer, the first dummy line being adjacent to the defective pixel, short-circuiting a second switching element and the first dummy line, the second switching element being disposed in parallel with the first switching element in a first direction, and the second switching element being in the non-display area adjacent to first ends of the first dummy lines, short-circuiting a second dummy line and the data line connected to the defective pixel, the second dummy line being adjacent to the first dummy line, and short-circuiting the second dummy line and a third dummy line, the second dummy lines being perpendicular to the first dummy lines and adjacent to the second switching elements.

Each of the first switching elements may include: a switching thin film transistor configured to include a first source electrode, a first gate electrode, and a first drain electrode; and a driving thin film transistor configured to include a second source electrode, a second gate electrode, and a second drain electrode, and each of the second switching elements may include: a switching thin film transistor configured to include a third source electrode, a third gate electrode, and a third drain electrode; and a driving thin film transistor configured to include a fourth source electrode, a fourth gate electrode, and a fourth drain electrode.

The insulating of the first switching element and the organic light emitting layer may include cutting off the second drain electrode of the first switching element.

The insulating of the first switching element and the organic light emitting layer may include cutting off an anode electrode located between the first drain electrode and the organic emission layer.

The short-circuiting of the pixel-adjacent first dummy line and the organic emission layer may include connecting the pixel-adjacent first dummy line to the second drain electrode.

The short-circuiting of the pixel-adjacent first dummy line and the organic emission layer may include connecting the pixel-adjacent first dummy line to an anode electrode.

The short-circuiting of the second switching element and the pixel-adjacent first dummy line may include connecting the fourth drain electrode of the second switching element to the pixel-adjacent first dummy line.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, exemplary embodiments will be described in detail with reference to the attached drawings. As those skilled in the art would realize, the described embodiments may be modified in various different ways, all without limiting or departing from the spirit or scope of the present disclosure. Rather, these embodiments are provided so that this disclosure will be thorough and complete, and will fully convey exemplary implementations to those skilled in the art. The drawings and description are to be regarded as illustrative in nature and not restrictive. Like reference numerals designate like elements throughout the specification.

In addition, the size and thickness of each component shown in the drawings are shown for better understanding and ease of description, but the embodiments are not limited thereto. Further, in the drawings, the thickness of layers, films, panels, regions, etc., may be exaggerated for clarity. When a layer, a film, a plate, an element or the like is described as being arranged "on" or "over" another layer, film, plate, or element, this indicates that the layers, films, plates, or elements are arranged on or over each other directly or with a third layer, film, plate, or element intervening therebetween without the limitation to an upper side thereof on the basis of the gravity direction.

Further, throughout this specification, when a part is described as "comprising (or including)" constituent elements, this indicates that the part may further include other constituent elements unless particularly otherwise defined. Furthermore, when the first part is described as being arranged "on" the second part, this indicates that the first part is arranged at an upper side or a lower side of the second part without the limitation to the upper side thereof on the basis of the gravity direction.

Referring to FIG. 1 to FIG. 4, an organic light emitting display device in accordance with an exemplary embodiment connects a defective pixel to a dummy element by using first to third dummy lines formed in a display area and a non-display area to repair the defective pixel.

The organic light emitting display device of the present exemplary embodiment may include a substrate, a plurality of scan lines 121, a plurality of data lines 171, first switching elements CR1 to CR3, organic emission layers LD1 to LD3, first dummy lines 100, second switching elements CRD1 to CRD3, and second and third dummy lines 171' and 171".

The substrate may be formed of an insulating substrate made of, e.g., glass, quartz, ceramic, plastic, or the like, but is not limited thereto. For example, the substrate may be formed of a metal substrate, e.g., made of stainless steel or the like.

The substrate is divided into a display area II and non-display areas I and III. In the display area II, pixels for displaying images are located, while in the non-display areas I and III, drivers for driving the display area II to display images, and the like are located.

As shown in FIG. 1 to FIG. 4, the first switching elements CR1, CR2, and CR3, the organic emission layers LD1, LD2, and LD3, the data lines 171, and the first dummy line 100 are located in the display area II. The second and third dummy lines 171' and 171" are located in the non-display areas I and III. The first to third dummy lines 100, 171', and 171" are used to connect an organic emission layer to a second switching element of a defective pixel. This will be described in detail later.

The scan lines 121 may be extended in a first direction over the display and non-display areas I, II, and III to connect to the first and second switching elements CR1 to CR3 and CRD1 to CRD3. For example, a scan line 121a of the scan lines 121 is connected to gate electrodes 270a, 280a, and 270a' of first through third switching elements CRD1, CR1, and CRD1', respectively. Further, a connection part formed at one end of a scan line 121 may be connected to a gate driver.

The scan lines 121 may be formed of the same layer as the gate electrodes 270a, 270a', and 280a. Further, the scan lines 121 may be formed of the same material as the gate electrodes 270a, 270a', and 280a.

The data lines 171 may be extended in a second direction intersecting the first direction in the display area II. The data lines 171 may be extended to intersect the scan lines 121, respectively. In this case, the data lines 171 are connected to the first switching elements CR1 to CR3. In detail, the data lines 171 are connected to first source electrodes 220a to 220c of the first switching elements CR1 to CR3 to transfer data signals. Further, a connection part formed at one end of a data line 171 may be connected to a data driver.

The data lines 171 may be formed of the same layer as the first source electrodes 220a to 220c. Further, the data lines 171 may be formed of the same material as the first source electrodes 220a to 220c.

Figure 3:
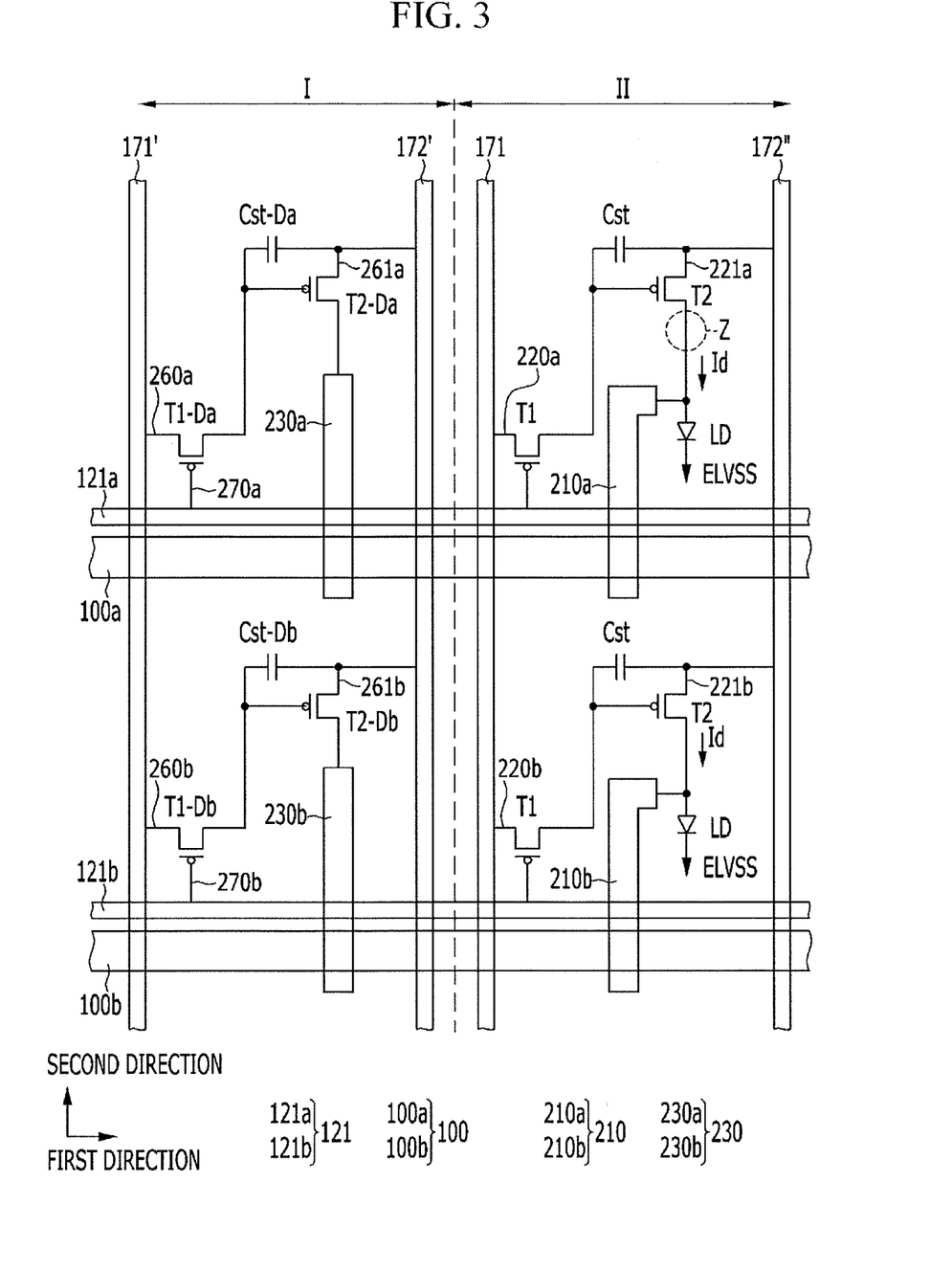
FIG. 3 illustrates a partial circuit diagram of the organic light emitting display device shown in FIG. 1.
Figure 4:
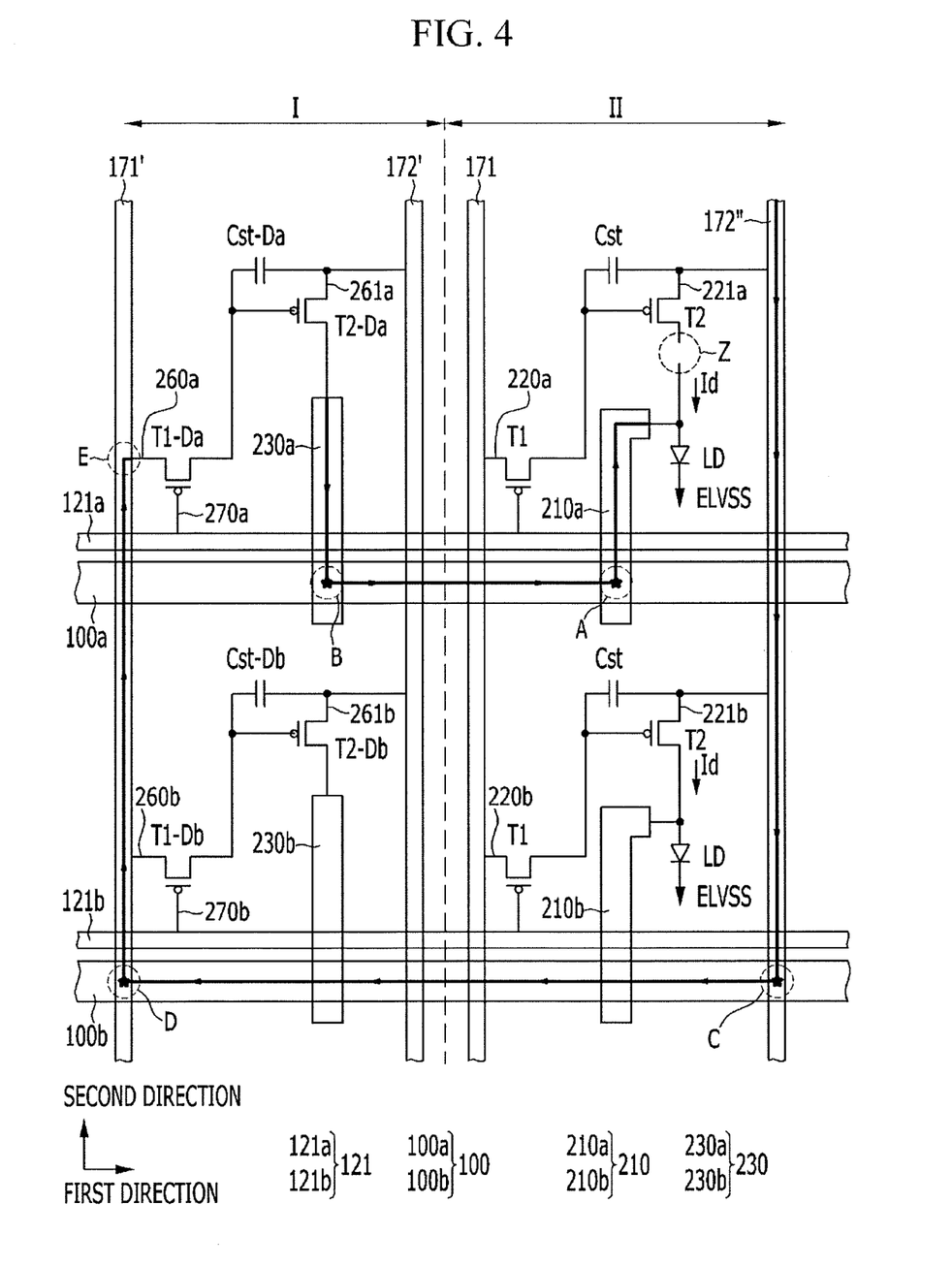
FIG. 4 illustrates a partial circuit diagram of a repaired state of the organic light emitting display device shown in FIG. 3.

Referring to FIG. 3 and FIG. 4, driving voltage lines 172' and 172" are extended in the second direction. The driving voltage line 172' is located in the non-display area I, while the driving voltage line 172" is located in the display area II. The driving voltage line 172' is connected to fourth source electrodes 261a and 261b of the second switching elements CRD1 and CRD2. The driving voltage line 172" is connected to second source electrodes 221a and 221b of the first switching elements CR1 and CR2.

Each of the first switching elements CR1 to CR3 includes a switching thin film transistor and a driving thin film transistor. Herein, each of the first switching elements CR1 to CR3 may further include a storage capacitor Cst, e.g., the storage capacitor Cst may be any suitable capacitor and a detailed description thereof will be omitted.

The first switching elements CR1 to CR3 respectively drive organic emission layers LD1 to LD3 to be described later. Switching thin film transistors of the first switching elements CR1 to CR3 respectively include first source electrodes 220a, 220b, and 220c, first gate electrodes 280a, 280b, and 280c, and first drain electrodes. As described above, first source electrodes 220a to 220c are connected to the data line 171. The first gate electrodes 280a to 280c of the switching thin film transistors are connected to the scan line 121.

Each driving thin film transistor of the first switching elements CR1 to CR3 includes a second source electrode, a second gate electrode, and a second drain electrode. The driving thin film transistors of the first switching elements CR1 to CR3 may be connected to the organic emission layers LD1 to LD3. As shown in FIG. 2 to FIG. 5, members indicated by reference numerals 240a, 240b, and 240c, which connect the organic emission layers LD1 to LD3 to the first switching elements CR1 to CR3, may respectively be second drain electrodes of the anode or driving thin film transistors. The reference numerals 240a to 240c respectively indicate cut-off areas between the first switching elements CR1 to CR3 and the organic emission layers LD1 to LD3 in the repairing method of an organic light emitting display device in accordance with the present exemplary embodiment. This will be described in detail later.

As shown in FIG. 1 to FIG. 4, members indicated by reference numerals 210a, 210b, and 210c, which overlap with the first dummy lines 100, may respectively be anode electrodes or second drain electrodes. In other words, the first dummy lines 100 may overlap with the anode electrodes or the second drain electrodes in the repairing method of an organic light emitting display device in accordance with the present exemplary embodiment. This will also be described in detail later.

The organic emission layers LD1 to LD3 connected to the first switching elements CR1 to CR3 are formed of a low molecular organic material or a high molecular organic material. Each of the organic emission layers LD1 to LD3 may be formed of a multilayer that includes the emission layer and at least one of a hole injection layer (HIL), a hole transport layer (HTL), an electron transport layer (ETL), and an electron injection layer (EIL). When all of the above layers are included, the HIL is disposed on the anode electrode, and the HTL, the emission layer, the ETL, and the EIL are sequentially layered thereon. The organic emission layers LD1 to LD3 are identified as colors, e.g., red, green, blue, and the like, according to material types thereof.

The first dummy lines 100 may be extended in the first direction. The first dummy lines 100 may be formed to extend over the display areas II and the non-display areas I and III on the substrate. The first dummy lines 100 may be used to connect defective pixels to dummy elements, i.e., to the second or third switching elements CRD1 to CRD3 or CRD1' to CRD3'.

Each of the first dummy lines 100 may be disposed between corresponding adjacent scan lines 121. For example, a first dummy line 100a is located between the scan line 121a and an adjacent scan line 121b. Similarly, a first dummy line 100b is located between the scan line 121b and an adjacent scan line 121c.

The first dummy lines 100 are overlapped with the data lines 171. In this case, the first dummy lines 100 and the data lines 171 which are overlapped with each other may be connected to each other in the repairing operation of the defective pixel.

Further, as described above, the first dummy lines 100 may be overlapped with the members indicated by the reference numerals 210a to 210c. In the present exemplary embodiment, the reference numerals 210a to 210c may indicate the anode electrodes or the second drain electrodes. Further, the first dummy lines 100 and the members indicated by the reference numerals 210a to 210c which are overlapped with each other may be connected to each other in the repairing operation of the defective pixel.

The first dummy lines 100 are also overlapped with fourth drain electrodes 230a to 230c of the second switching elements CRD1 to CRD3 to be described later. In addition, the first dummy lines 100 are overlapped with the second and third dummy lines 171' and 171" to be described later in the non-display area I. The second dummy lines 171' or the third dummy lines 171" may be connected with the first dummy lines 100 in the repairing operation of the defective pixel.

In the meantime, the first dummy lines 100 may be formed of the same layer as that of gate electrodes of the first and second switching elements CR1 to CR3 and CRD1 to CRD3. In this case, the first dummy lines 100 may be made of the same material as that of the gate electrodes.

Referring to FIG. 1 to FIG. 4, the second switching elements CRD1 to CRD3 are located in the non-display area I. The second switching elements CRD1 to CRD3 may serve as dummy elements to be connected to the organic emission layer LD1 to LD3 instead of the first switching element CR1 to CR3 of a defective pixel. In this case, each of the second switching elements CRD1 to CRD3 includes a switching thin film transistor and a driving thin film transistor. Each of the second switching elements CRD1 to CRD3 may further include a storage capacitor Cst-Da or Cst-Db. The detailed description thereof will be omitted.

The switching thin film transistors of the second switching elements CDR1 to CRD3 respectively include third source electrodes 260a, 260b, and 260c, third gate electrodes 270a, 270b, and 270c, and third drain electrodes. The third source electrodes 260a to 260c are connected to the second dummy lines 171' to be described later. The third gate electrodes 270a to 270c are connected to the scan lines 121.

Referring to FIG. 3 and FIG. 4, the driving thin film transistors of the second switching elements CDR1 to CRD3 include the fourth source electrodes 261a and 261b, fourth gate electrodes, and the fourth drain electrodes 230a and 230b. As described above, the fourth drain electrodes 230a and 230b are overlapped with the first dummy lines 100. The fourth source electrodes 261a and 261b are connected to the driving voltage line 172'.

The second dummy lines 171' are formed to extend in the second direction in the non-display area I. In this case, the second dummy lines 171' are located adjacent to the second switching elements CRD1, CRD2, and CRD3. The second dummy lines 171' are connected to the third source electrodes 260a, 260b, and 260c of the second switching elements CRD1, CRD2, and CRD3 in the non-display area I.

The second dummy lines 171' may be formed of the same layer as that of third source electrodes 260a, 260b, and 260c.

Further, the second dummy lines 171' may be made of the same material as that of the third source electrodes 260a, 260b, and 260c.

Figure 1:
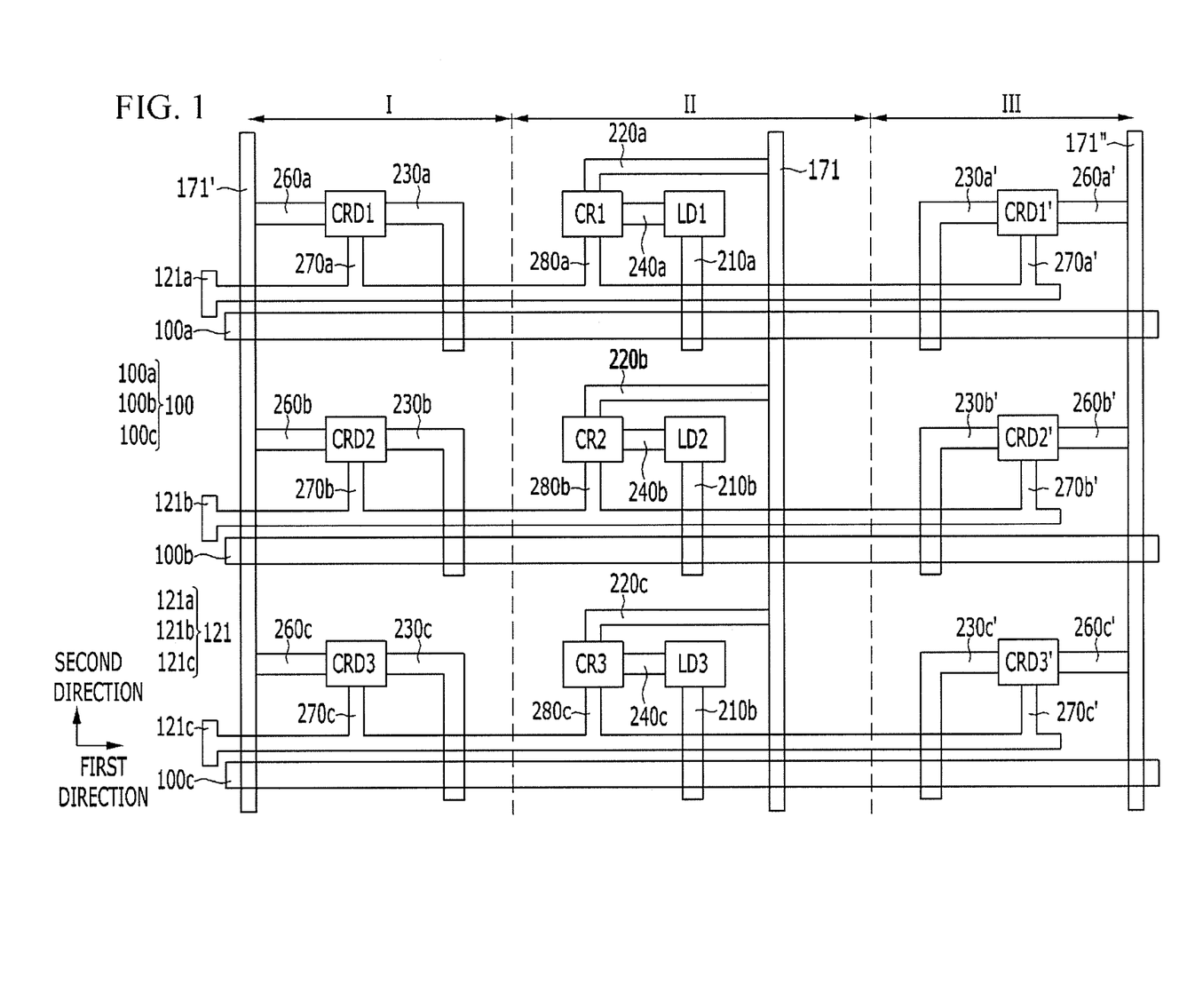
FIG. 1 illustrates a schematic layout view of an organic light emitting display device in accordance with an exemplary embodiment.
Figure 2:
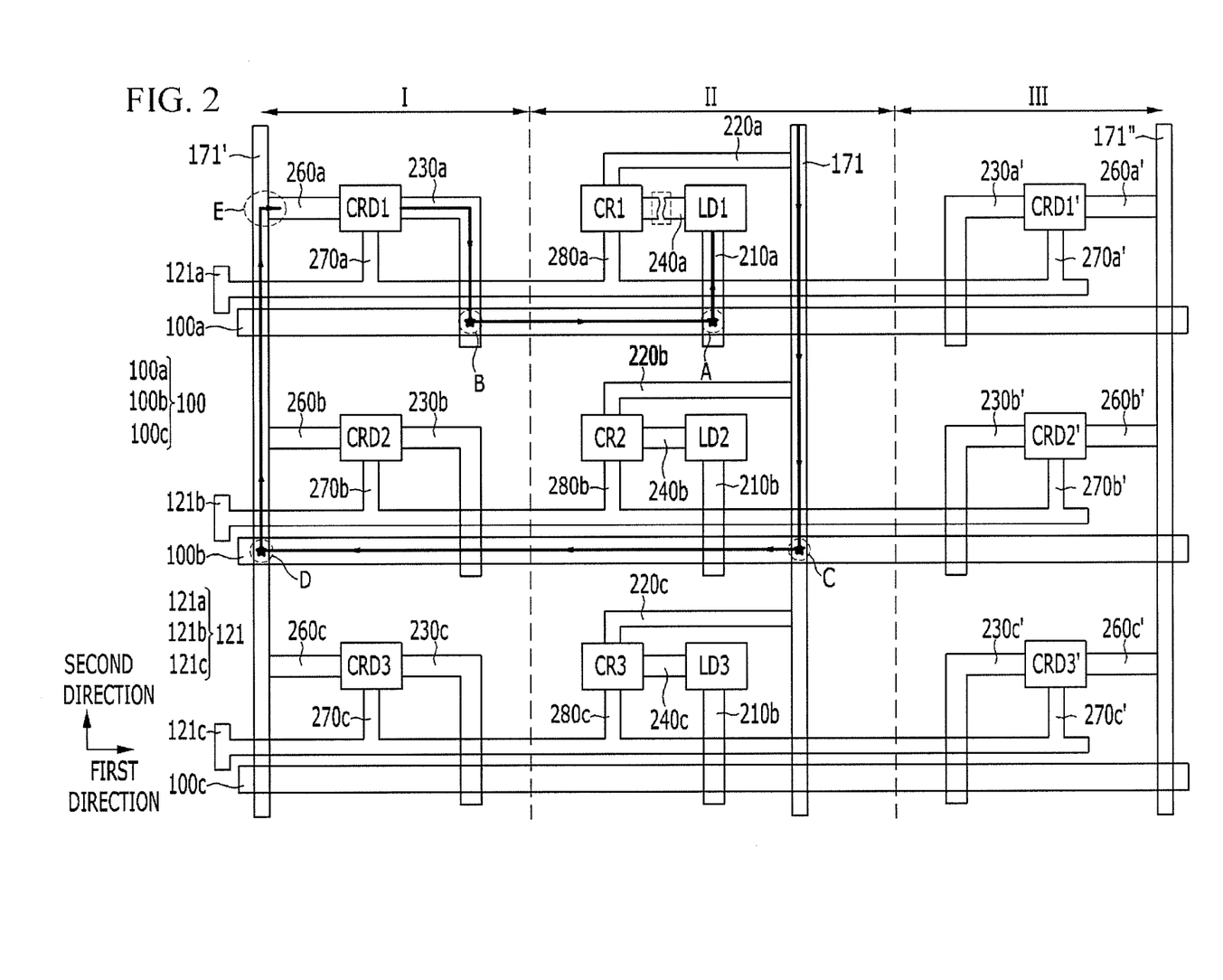
FIG. 2 illustrates a schematic layout view of a repaired state of the organic light emitting display device shown in FIG. 1 in which a defective pixel is generated.

In the meantime, referring to FIG. 1 and FIG. 2, the third dummy lines 171" and the third switching elements CRD1', CRD2', and CRD3' may be located in the non-display area III. In this case, the third dummy lines 171" and third switching elements CRD1', CRD2', and CRD3' respectively correspond to the second dummy lines 171' and the second switching elements CRD1, CRD2, and CRD3 in the non-display area I. In other words, since the third dummy lines 171" and the third switching elements CRD1', CRD2', and CRD3' respectively perform the same functions as those of the second dummy line 171' and second switching elements CRD1, CDRD2, and CRD3, the detailed description thereof will be omitted.

The repairing method of an organic light emitting display device in accordance with the exemplary embodiment will now be described with reference to FIGS. 1-4 and FIG. 7. In the present exemplary embodiment, it is assumed that a defect is generated in a pixel including the first switching element CR1 and the organic emission layer LD1 of the display area I.

Figure 7:
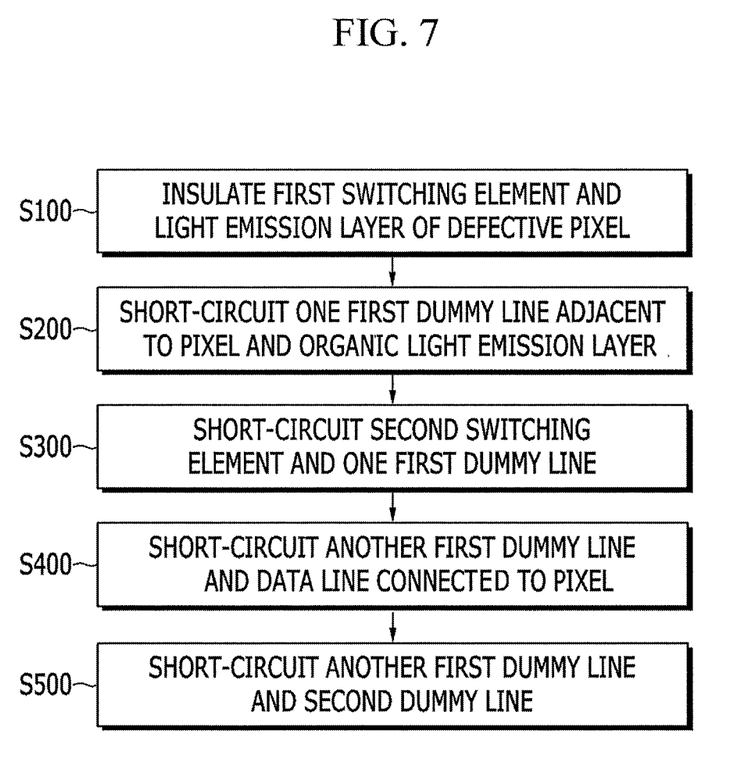
FIG. 7 illustrates a flowchart of a repairing method of the organic light emitting display device in accordance with the present exemplary embodiment.

First, in a defective pixel, the first switching element CR1 is insulated from the organic emission layer LD1 (S100).

As shown in FIGS. 2 and 4, member 240a, which connects the first switching element CR1 to the organic emission layer LD1, is cut off. As described above, in the present exemplary embodiment, the member 240a may be the anode electrode or the second drain electrode. As the anode electrode or the second drain electrode is cut off, a current supplied to the organic emission layer LD1 can be blocked.

In the repairing method of an organic light emitting display device in accordance with the present exemplary embodiment, a laser device may be used to cut off a specific electrode or to connect a plurality of electrodes or layers. However, embodiments are not limited to cutting-off by a laser and any other suitable method of cutting-off or connecting in a typical manufacturing or repairing process of a display device may be applied thereto without being limited to the laser device.

Next, the organic emission layer LD1 and the first dummy line 100a adjacent to a defective layer among the plurality of first dummy lines 100 are short-circuited (S200).

Referring to FIG. 2 and FIG. 4, the first dummy line 100a is connected to the member 210a to short-circuit the first dummy line 100a and the organic emission layer LD1. In other words, the first dummy line 100a and the member 210a are connected to each other at a first location A at which they are overlapped with other. As described above, the member 210a may be the anode electrode or the second drain electrode, so the first dummy line 100a can be connected to the anode electrode or the second drain electrode.

Next, the first dummy line 100a and the second switching element CRD1 serving as the dummy element are short-circuited (S300). Herein, the second switching element CRD1 is a second switching element disposed in the first direction in parallel with the first switching element CR1 of the defective pixel.

The first dummy line 100a and the fourth drain electrode 230a are connected to each other when the first dummy line 100a and the second switching element CRD1 are short-circuited, i.e., in operation S300. As described above, the fourth drain electrode 230a of the second switching element CRD1 and the first dummy line 100a are overlapped with each other and connected to each other at a second location B. In other words, at the second location B, the first dummy line 100a and the fourth drain electrode 230a are connected to each other.

Next, the first dummy line 100b adjacent to the first dummy line 100a and the data line 171 are short-circuited (S400). The data line 171 intersects the first dummy line 100b at a third location C at which they are overlapped with each other. In other words, at the third location C, the data line 171 is connected to the first dummy line 100a.

Next, the first dummy line 100b and the second dummy line 171' are short-circuited (S500). The second dummy line 171' is adjacent to the second switching element CRD1, and extends in the second direction in the non-display area I. In this case, the first dummy line 100b and the second dummy line 171' intersect each other at a fourth location D in the non-display area I. Accordingly, the first dummy line 100b and the second dummy line 171' are connected to each other at the fourth location D.

As described above, it is possible to repair the defective pixel by short-circuiting the first dummy lines 100a and 100b, the second dummy line 171' and the data line 171. In brief, a defective first switching element CR1 is separated from the organic emission layer LD1, and the second switching element CRD1 is connected to the organic emission layer LD1 via a portion of the first dummy lines 100a. As a result, current flows from the second switching element CRD1 to the organic emission layer LD1. Further, a data signal transmitted to the defective first switching element CR1 is also transferred to the second switching element CRD1 through the data line 171, the first dummy line 100b, and the second dummy line 171.'

In the repairing method of an organic light emitting display device in accordance with the present exemplary embodiment, the order of the short-circuiting steps S200 to S500 may be varied.

Figure 5:
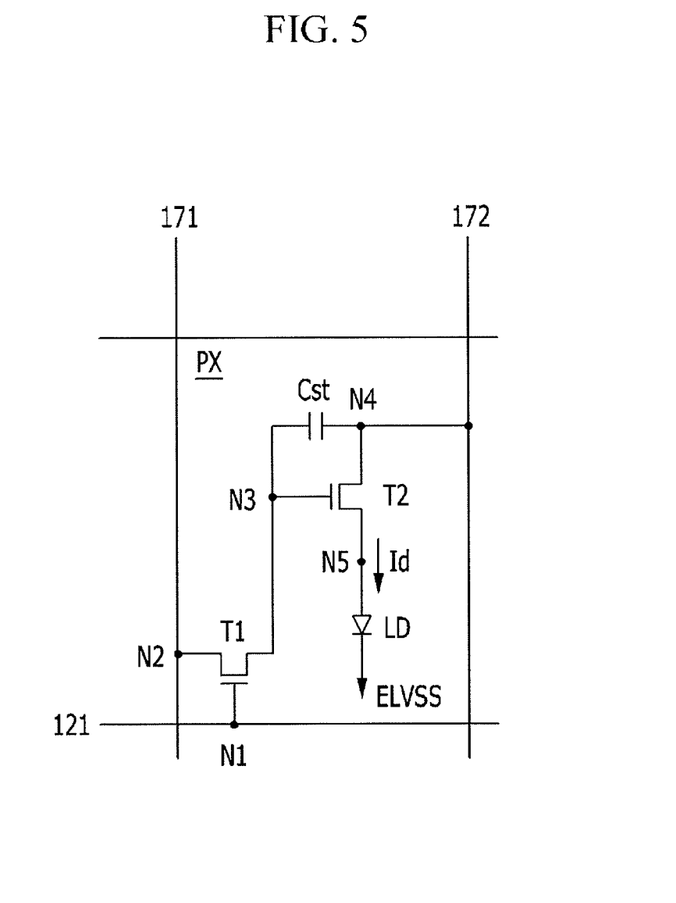
FIG. 5 illustrates an equivalent circuit diagram of a pixel of the organic light emitting display device in accordance with the present exemplary embodiment.
Figure 6:
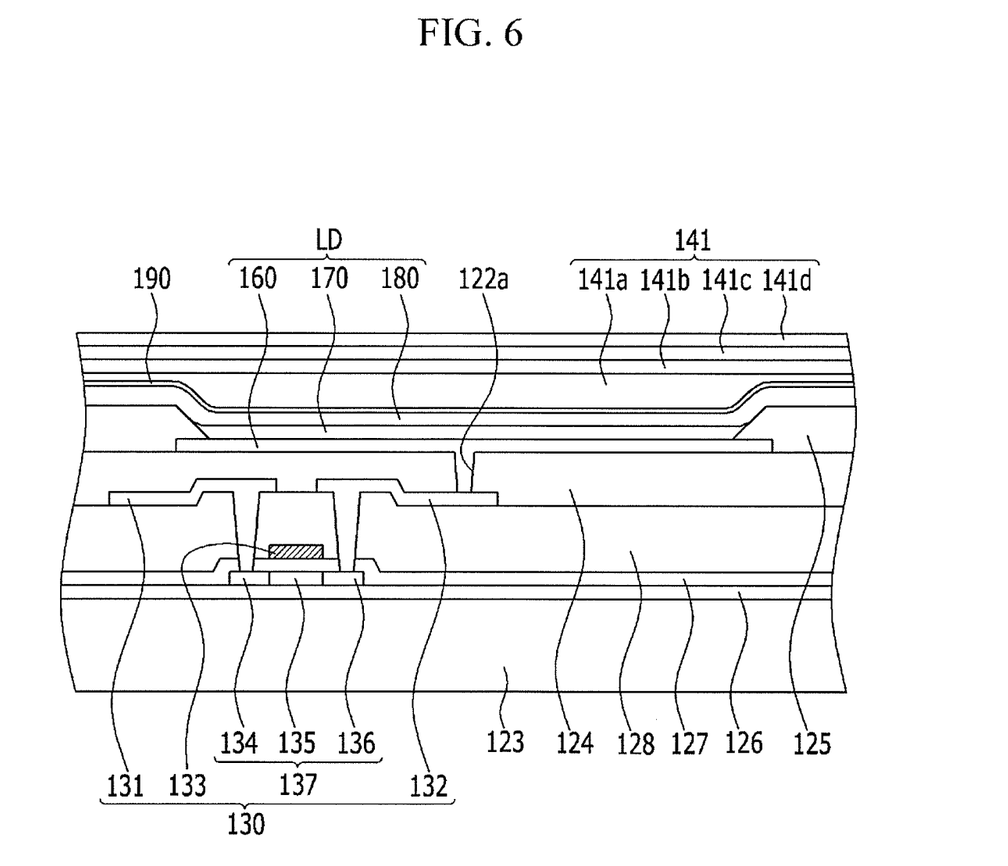
FIG. 6 illustrates a cross-sectional view of the organic light emitting display device in accordance with the present exemplary embodiment.

FIG. 5 illustrates an equivalent circuit diagram showing a pixel of the organic light emitting display device in accordance with the present exemplary embodiment. FIG. 6 illustrates a cross-sectional view showing the organic light emitting display device in accordance with the present exemplary embodiment.

Hereinafter, the cross-section and the circuit diagram of one pixel of the organic light emitting display device in accordance with the present exemplary embodiment will be described with reference to FIG. 5 and FIG. 6. However, the present exemplary embodiment can be applied to pixels having various structures without being limited to the structure shown in FIG. 5 and FIG. 6.

Referring to FIG. 5, an organic light emitting display device includes the plurality of signal lines 121, 171, and 172, and a pixel PX connected thereto. The pixel PX may be any one of a red pixel R, a green pixel G, and a blue pixel B.

The signal lines include scanning signal lines 121 for transmitting gate signals (or scan signals), data lines 171 for transmitting data signals, and driving voltage lines 172 for transmitting driving voltage. The scan signal lines 121 are substantially extended in a row direction and are substantially parallel with each other, and the data lines 171 are substantially extended in a column direction and are substantially parallel with each other. The driving voltage lines 172 are shown to be substantially extended in a column direction, but they can be extended in the row direction or the column direction or formed as a mesh net, e.g., in a grid pattern.

One pixel PX includes a switching transistor T1, a driving transistor T2, a storage capacitor Cst, and an organic light emitting element LD. Although not shown in the drawing, the pixel PX may further include a thin film transistor and capacitor so as to compensate the current supplied to the organic light emitting element.

The switching transistor T1 includes a control terminal N1, an input terminal N2, and an output terminal N3, and the control terminal N1 is connected to the scan signal line 121, the input terminal N2 is connected to the data line 171, and the output terminal N3 is connected to the driving transistor T2. The switching transistor T1 transmits the data signal provided by the data line 171 to the driving transistor T2 in response to the scan signal provided by the scan signal line 121.

The driving transistor T2 includes a control terminal N3, an input terminal N4, and an output terminal N5, and the control terminal N3 is connected to the switching transistor T1, the input terminal N4 is connected to the driving voltage line 172, and the output terminal N5 is connected to the organic light emitting element LD. The driving transistor T2 outputs an output current Id that is variable by a voltage between the control terminal N3 and the output terminal N5.

The capacitor Cst is connected between the control terminal N3 and the input terminal N4 of the driving transistor T2. The capacitor Cst charges the data signal applied to the control terminal N3 of the driving transistor T2 and maintains the charge when the switching transistor T1 is turned off.

The organic light emitting element LD is exemplarily an organic light emitting diode (OLED), and includes an anode connected to the output terminal N5 of the driving transistor T2 and a cathode connected to the voltage Vss. The organic light emitting element LD displays an image by emitting light with different intensities depending on the output current Id of the driving transistor T2.

The organic light emitting element LD may include an organic material for emitting one or at least one of primary colors (i.e., red, green and blue), and the organic light emitting device displays the desired image by a spatial sum of the colors.

The switching transistor T1 and the driving transistor T2 are n-channel field effect transistors (FETs), and at least one of them may be a p-channel field effect transistor. Also, the connection between the transistors T1 and T2, the capacitor Cst, and the organic light emitting element LD is changeable.

Hereinafter, the organic light emitting display device of the present exemplary embodiment will be described with reference to the cross-section thereof shown in FIG. 6.

Referring to FIG. 6, a substrate 123 may be formed as an insulating substrate, e.g., made of glass, quartz, ceramic, plastic, and the like. However, embodiments are not limited thereto, and the substrate 123 may also be formed as a metallic substrate, e.g., made of stainless steel and the like.

A buffer layer 126 is formed on the substrate 123. The buffer layer 126 serves to prevent penetration of impurity elements and to planarize the surface of the substrate 123. The buffer layer 126 may be formed of various materials capable of performing the above-mentioned functions. As an example, one of a silicon nitride ($SiN_x$) layer, a silicon oxide ($SiO_x$) layer, and a silicon oxynitride ($SiO_xN_y$) layer may be employed as the buffer layer 126. However, the buffer layer 126 may be omitted according to type and process conditions of the substrate 123.

A driving semiconductor layer 137 may be formed on the buffer layer 126. The driving semiconductor layer 137 may be formed of a polysilicon film. The driving semiconductor layer 137 includes a channel region 135 in which impurities are not doped, and a source region 134 and a drain region 136 which are doped and formed at opposite sides of the channel region 135. In this case, the ionic material to be doped is a p-type impurity, e.g., boron (B) or $B_2H_6$. In this case, the impurity may be changed according to a kind of the thin film transistor.

A gate insulating layer 127, e.g., formed of a silicon nitride ($SiN_x$) or a silicon oxide ($SiO_x$), is formed on the driving semiconductor layer 137. A gate wire including a driving gate electrode 133 is formed on the gate insulating layer 127. In addition, the driving gate electrode 133 is formed to be overlapped with at least a part of the driving semiconductor layer 137, e.g., the channel region 135.

An interlayer insulating layer 128 covering the driving gate electrode 133 is formed on the gate insulating layer 127. Through holes exposing the source region 134 and the drain region 136 of the driving semiconductor layer 137 are formed in the gate insulating layer 127 and the interlayer insulating layer 128. The interlayer insulating layer 128 may be formed by using a ceramic-series material, e.g., silicon nitride ($SiN_x$), silicon oxide ($SiO_x$), or the like, similar to the gate insulating layer 127.

A data wire including a driving source electrode 131 and a driving drain electrode 132 is formed on the interlayer insulating layer 128. In addition, the driving source electrode 131 and the driving drain electrode 132 are respectively connected to the source region 134 and the drain region 136 of the driving semiconductor layer 137 via through holes formed in the interlayer insulating layer 128 and the gate insulating layer 127.

As such, a driving thin film transistor 130 including the driving semiconductor layer 137, the driving gate electrode 133, the driving source electrode 131, and the driving drain electrode 132 is formed. The configuration of the driving thin film transistor 130 is not limited to the above-described examples, and may be variously changed into any suitable configuration.

A planarization layer 124 covering the data wire is formed on the interlayer insulating layer 128. The planarization layer 124 serves to planarize the interlayer insulating layer 128 by eliminating steps in order to increase the light emitting efficiency of the organic light emitting element to be formed thereon. In addition, the planarization layer 124 has an electrode contact hole 122a exposing a part of the drain electrode 132. The planarization layer 124 may be made of, e.g., at least one material of polyacrylate resin, epoxy resin, phenolic resin, polyamide resin, polyimide resin, unsaturated polyester resin, polyphenylene ether resin, polyphenylene sulfide resin, and benzocyclobutene (BCB). This exemplary embodiment is not limited to the above-described configuration, e.g., the planarization layer 124 and/or the interlayer insulating layer 128 may be omitted in some cases.

A pixel electrode 160 serving as a first electrode of the organic light emitting element is formed on the planarization layer 124. In other words, the organic light emitting display device includes a plurality of pixel electrodes 160 respectively disposed for a plurality of pixels. Herein, the pixel electrodes 160 are separated from each other. Each of the pixel electrodes 160 is connected to the drain electrode 132 through an electrode contact hole 122a of the planarization layer 124.

Further, a pixel defining layer 125 having an opening that exposes the pixel electrode 160 is formed on the planarization layer 124. That is, the pixel defining layer 125 has a plurality of openings that are individually formed for each pixel. An organic emission layer 170 may be formed for each opening formed by the pixel defining layer 125. Accordingly, a pixel region in which each organic emission layer is formed may be defined by the pixel defining layer 125.

In this case, the first electrode 160 is disposed so as to correspond to the opening of the pixel defining layer 125. However, the pixel electrode 160 is not necessarily disposed in the opening of the pixel defining layer 125. The pixel electrode 160 may be disposed beneath the pixel defining layer 125 in such a way so as to be partially overlapped by the pixel defining layer 125. The pixel defining layer 125 may be made of, e.g., a resin such as polyacrylate resin, polyimide resin, or the like, or a silica-series inorganic material.

Meanwhile, the organic emission layer 170 is formed on the pixel electrode 160. Further, a common electrode 180 serving as a second electrode of the organic light emitting element may be formed on the organic emission layer 170. As such, the organic light emitting element LD including the pixel electrode 160, the organic emission layer 170, and the common electrode 180 is formed.

Each of the pixel electrode 160 and the common electrode 180 may be formed of a transparent conductive material, or a semitransparent or reflective conductive material. The OLED display may be a top emission type, a bottom emission type, or a both-side emission type according to a kind of the material of the pixel electrode 160 and the common electrode 180.

A cover film 190 covering the common electrode 180 may be formed of an organic film on the common electrode 180, e.g., to protect the common electrode 180. Further, a thin film encapsulation layer 141 is formed on the cover layer 190. The thin film encapsulation layer 141 seals and protects the organic light emitting element LD and a driving circuit portion formed on the substrate 123 from the outside.

The thin film encapsulation layer 141 includes organic encapsulation layers 141a and 141c and inorganic encapsulation layers 141b and 141d alternately laminated one by one. FIG. 6 illustrates a case where the two organic encapsulation layers 141a and 141c and the two inorganic encapsulation layers 141b and 141d are alternately stacked one by one to constitute the thin film encapsulation layer 141 as an example, but it is not limited thereto.

According to a repairing method of an organic light emitting display device in accordance with the exemplary embodiments, it is possible to simplify a recovery of a defective pixel in the organic light emitting display device by short-circuiting and insulating operations of multiple overlapped layers. That is, it is possible to simplify repair of a defective pixel in the organic light emitting display device by using first to third dummy lines to connect a dummy element located in a non-display area to an organic emission layer of the defective pixel, e.g., without removing portions of the dummy lines.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
a substrate including a display area and a non-display area;
a plurality of scan lines extended in a first direction on the substrate;
a plurality of data lines extended in a second direction intersecting the first direction;
a plurality of first switching elements in the display area, the plurality of first switching elements being connected to the scan lines and data lines;
organic emission layers connected to the first switching elements;
first dummy lines between corresponding adjacent ones of the plurality of scan lines, the first dummy lines extending in the first direction;
second switching elements disposed in the non-display area, the second switching elements being adjacent to first ends of the first dummy lines; and
second dummy lines extended in the second direction, the second dummy lines being adjacent to the second switching elements.

2. The organic light emitting display device as claimed in claim 1, further comprising third switching elements in the non-display area, the third switching elements being adjacent to second ends of the first dummy lines.

3. The organic light emitting display device as claimed in claim 2, further comprising third dummy lines extended in the second direction, the third dummy lines being adjacent to the third switching elements.

4. The organic light emitting display device as claimed in claim 3, wherein the first dummy lines are overlapped with the third dummy lines.

5. The organic light emitting display device as claimed in claim 1,
wherein: each of the first switching elements includes:
a switching thin film transistor including a first source electrode, a first gate electrode, and a first drain electrode; and
a driving thin film transistor including a second source electrode, a second gate electrode, and a second drain electrode, and
wherein each of the second switching elements includes:
a switching thin film transistor including a third source electrode, a third gate electrode, and a third drain electrode; and
a driving thin film transistor including a fourth source electrode, a fourth gate electrode, and a fourth drain electrode.

6. The organic light emitting display device as claimed in claim 5, wherein the first dummy lines overlap the second drain electrodes of the first switching elements.

7. The organic light emitting display device as claimed in claim 5, wherein the first dummy lines overlap anode electrodes which connect the second drain electrodes to the organic emission layers.

8. The organic light emitting display device as claimed in claim 5, wherein the first dummy lines overlap fourth drain electrodes of the second switching element.

9. The organic light emitting display device as claimed in claim 5, wherein the first dummy lines are in a same layer as the first to fourth gate electrodes.

10. The organic light emitting display device as claimed in claim 9, wherein the second dummy lines are connected to the third source electrodes.

11. The organic light emitting display device as claimed in claim 10, wherein the second dummy lines are in a same layer as the third source electrodes.

12. The organic light emitting display device as claimed in claim 1, wherein the first dummy lines overlap the data lines.

13. The organic light emitting display device as claimed in claim 1, wherein the first dummy lines overlap the second dummy lines.

14. A repairing method of an organic light emitting display device that includes a plurality of intersecting scan and data lines, organic emission layers connected to first switching elements, and first dummy lines between corresponding adjacent ones of the plurality of scan lines and parallel thereto, the method comprising:
- insulating a first switching element of an organic light emitting layer of a defective pixel from each other, the first switching element being connected to scan and data lines in a display area of a substrate;
- short-circuiting a first dummy line and the organic emission layer, the first dummy line being adjacent to the defective pixel;
- short-circuiting a second switching element and the first dummy line, the second switching element being disposed in parallel with the first switching element in a first direction, and the second switching element being in the non-display area adjacent to first ends of the first dummy lines;
- short-circuiting a second dummy line and the data line connected to the defective pixel, the second dummy line being adjacent to the first dummy line; and
- short-circuiting the second dummy line and a third dummy line, the second dummy lines being perpendicular to the first dummy lines and adjacent to the second switching elements.

15. The repairing method as claimed in claim 14, wherein: each of the first switching elements includes:
- a switching thin film transistor including a first source electrode, a first gate electrode, and a first drain electrode; and
- a driving thin film transistor including a second source electrode, a second gate electrode, and a second drain electrode, and wherein each of the second switching elements includes:
- a switching thin film transistor including a third source electrode, a third gate electrode, and a third drain electrode; and
- a driving thin film transistor including a fourth source electrode, a fourth gate electrode, and a fourth drain electrode.

16. The repairing method as claimed in claim 15, wherein insulating the first switching element and the organic light emitting layer includes cutting off the second drain electrode of the first switching element.

17. The repairing method as claimed in claim 15, wherein insulating the first switching element and the organic light emitting layer includes cutting off an anode electrode located between the first drain electrode and the organic emission layer.

18. The repairing method as claimed in claim 15, wherein short-circuiting the first dummy line and the organic emission layer includes connecting the first dummy line to the second drain electrode.

19. The repairing method as claimed in claim 15, wherein short-circuiting the first dummy line and the organic emission layer includes connecting the first dummy line to an anode electrode.

20. The repairing method as claimed in claim 15, wherein short-circuiting the second switching element and the first dummy line includes connecting the fourth drain electrode of the second switching element to the first dummy line.

* * * * *